United States Patent
Lee et al.

(10) Patent No.: US 12,400,941 B2
(45) Date of Patent: Aug. 26, 2025

(54) SEMICONDUCTOR DEVICE AND METHOD OF DISPOSING ELECTRICAL COMPONENTS OVER SIDE SURFACES OF INTERCONNECT SUBSTRATE

(71) Applicant: STATS ChipPAC Pte. Ltd., Singapore (SG)

(72) Inventors: GunHyuck Lee, Incheon (KR); HeeSoo Lee, Incheon (KR); SangHyun Son, Seoul (KR); Bokyeong Hwang, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 689 days.

(21) Appl. No.: 17/805,096

(22) Filed: Jun. 2, 2022

(65) Prior Publication Data
US 2023/0395477 A1    Dec. 7, 2023

(51) Int. Cl.
*H01L 23/498* (2006.01)
*H01L 21/48* (2006.01)
(Continued)

(52) U.S. Cl.
CPC .... *H01L 23/49805* (2013.01); *H01L 21/4853* (2013.01); *H01L 21/4857* (2013.01);
(Continued)

(58) Field of Classification Search
CPC ........... H01L 23/49805; H01L 21/4853; H01L 21/4857; H01L 21/565; H01L 23/3121; H01L 23/49822; H01L 23/49838; H01L 23/552; H01L 25/0655; H01L 25/50; H01L 23/5383; H01L 21/561; H01L 23/66; H01L 2224/81; H01L 25/0652; H01L 23/3128; H01L 23/49816; H01L 23/49833;
(Continued)

(56) References Cited

U.S. PATENT DOCUMENTS

| 5,763,943 A * | 6/1998 | Baker | H01L 25/0652 |
| | | | 257/725 |
| 7,875,973 B2 * | 1/2011 | Chiu | H05K 1/184 |
| | | | 257/737 |

(Continued)

*Primary Examiner* — Jonathan Han
(74) *Attorney, Agent, or Firm* — Robert D. Atkins; PATENT LAW GROUP: Atkins and Associates, P.C.

(57) ABSTRACT

A semiconductor device has an interconnect substrate with a conductive via. A first electrical component is disposed over a major surface of the interconnect substrate. An electrical interconnect compound is disposed over the conductive via exposed from a side surface of the interconnect substrate. The electrical interconnect compound can be applied with a tilt nozzle oriented at an angle. A second electrical component is disposed on the electrical interconnect compound on the conductive via exposed from the side surface of the interconnect substrate. A plurality of second electrical components can be disposed on two or more side surfaces of the interconnect substrate. The interconnect substrate can have a plurality of stacked conductive vias and the second electrical component is disposed over the stacked conductive vias. An encapsulant is deposited over the first electrical component and interconnect substrate. A shielding layer can be formed over the encapsulant.

32 Claims, 14 Drawing Sheets

(51) Int. Cl.
 *H01L 21/56* (2006.01)
 *H01L 23/31* (2006.01)
 *H01L 23/552* (2006.01)

(52) U.S. Cl.
 CPC ........ *H01L 21/565* (2013.01); *H01L 23/3121* (2013.01); *H01L 23/49822* (2013.01); *H01L 23/49838* (2013.01); *H01L 23/552* (2013.01)

(58) Field of Classification Search
 CPC . H01L 23/5384; H01L 23/5386; H01L 25/16; H01L 25/18; H01L 2224/14183
 See application file for complete search history.

(56) References Cited

U.S. PATENT DOCUMENTS

| | | | |
|---|---|---|---|
| 8,344,842 B1 | 1/2013 | Luzanov | |
| 10,587,060 B2 | 3/2020 | Takken et al. | |
| 10,887,994 B2* | 1/2021 | Kim | H05K 1/181 |
| 2012/0211867 A1* | 8/2012 | Seroff | H01L 25/0657 |
| | | | 257/E21.705 |
| 2015/0262981 A1* | 9/2015 | Yap | H01L 23/49548 |
| | | | 29/830 |
| 2023/0223321 A1* | 7/2023 | Zhou | H01L 23/49838 |
| | | | 438/125 |

* cited by examiner

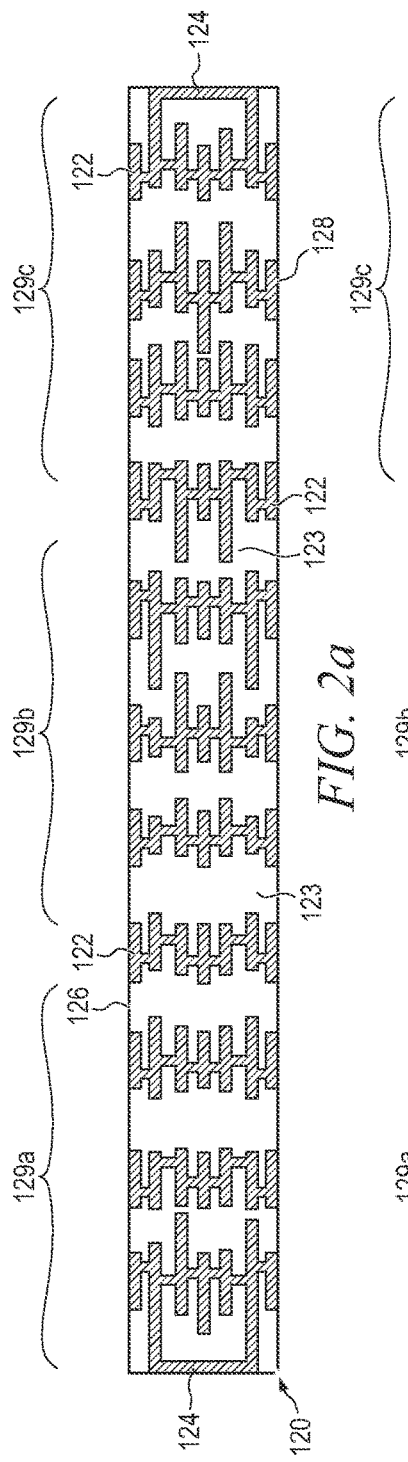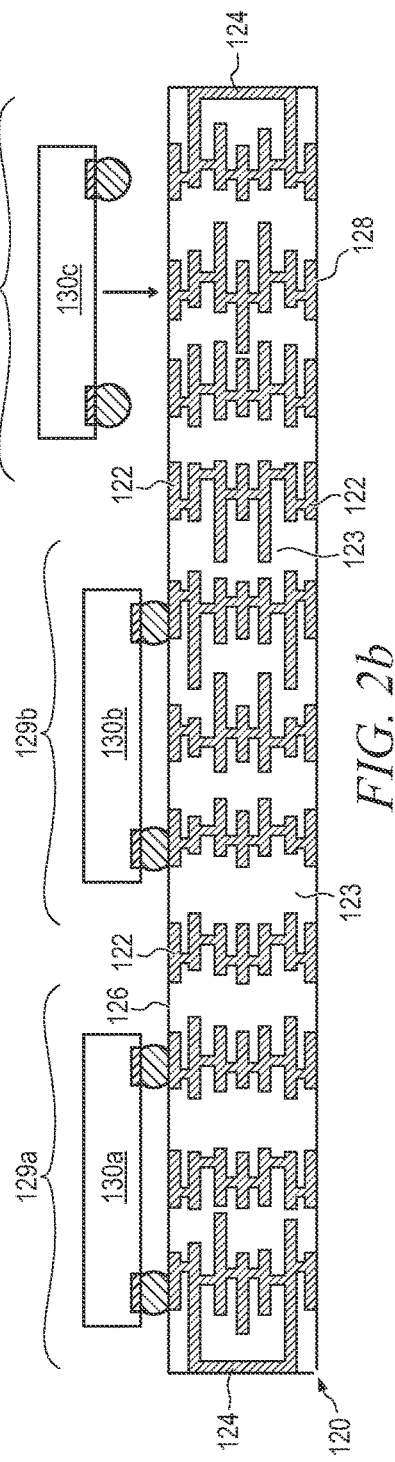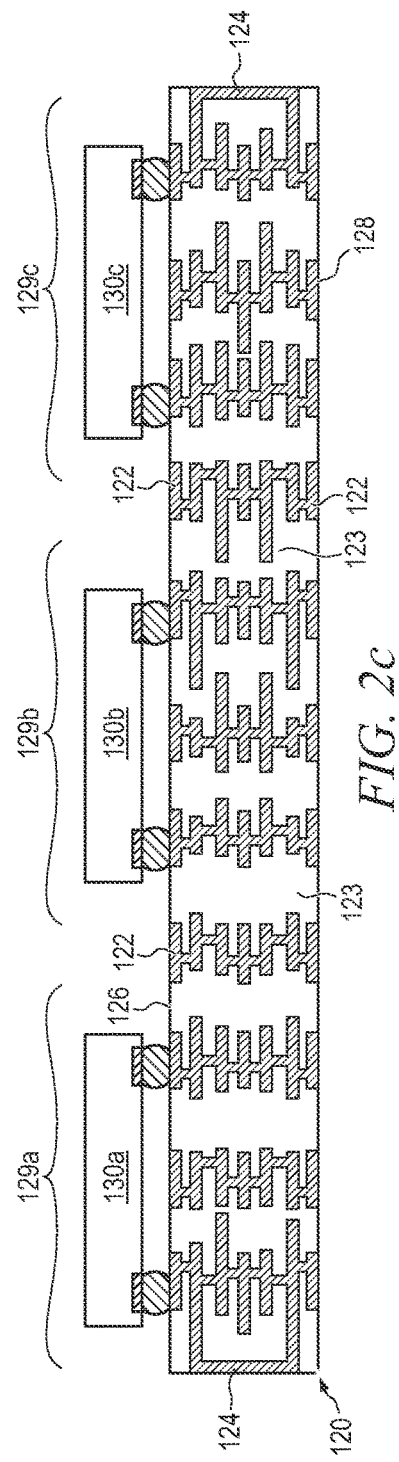

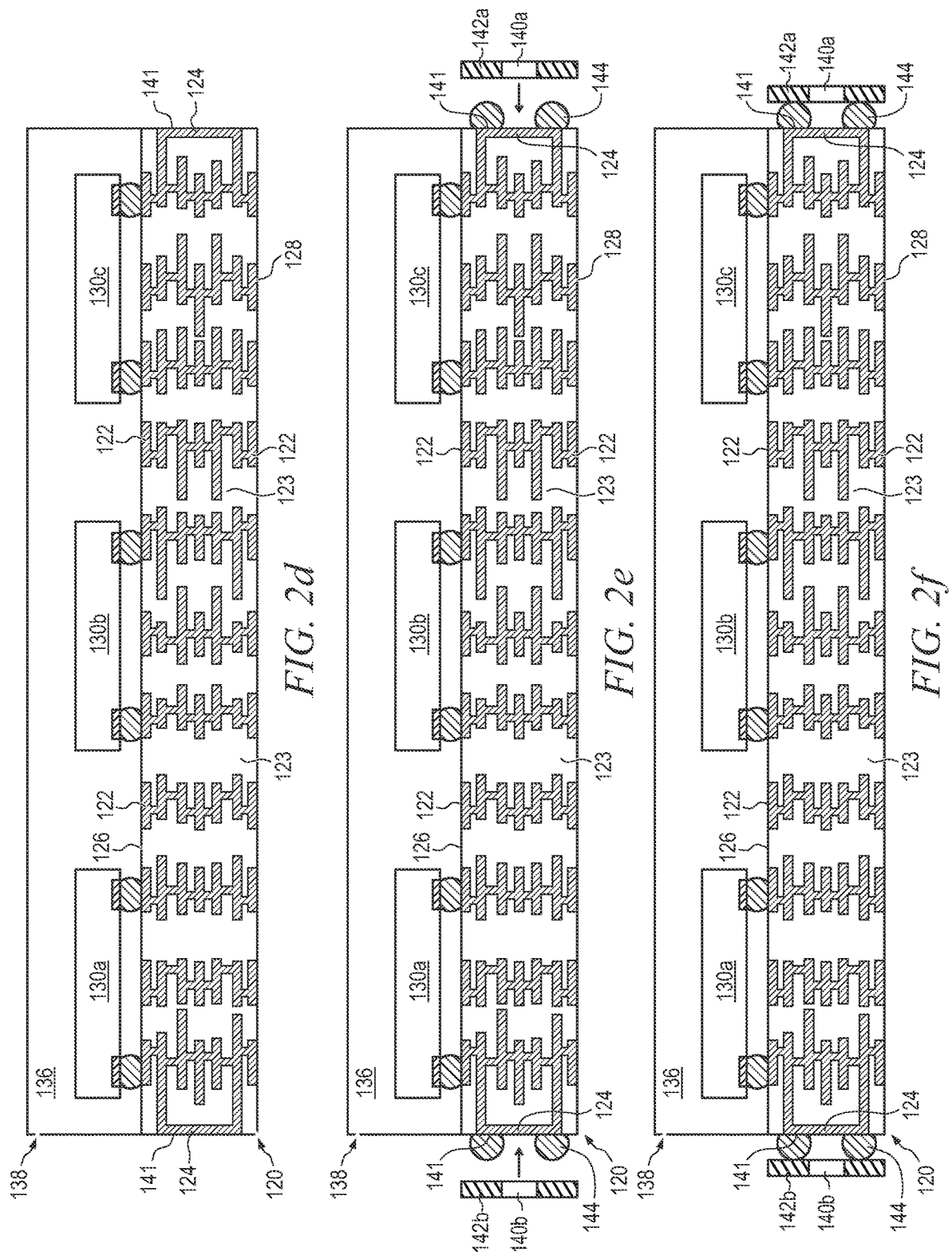

US 12,400,941 B2

SEMICONDUCTOR DEVICE AND METHOD OF DISPOSING ELECTRICAL COMPONENTS OVER SIDE SURFACES OF INTERCONNECT SUBSTRATE

FIELD OF THE INVENTION

The present invention relates in general to semiconductor devices and, more particularly, to a semiconductor device and method of disposing a plurality of electrical components over one or more side surfaces of an interconnect substrate.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices, particularly in high frequency applications, such as radio frequency (RF) wireless communications, often contain one or more integrated passive devices (IPDs) to perform necessary electrical functions. Multiple semiconductor die, IPDs, and other electrical components can be integrated into a system in package (SIP) module or other wafer level package (WLP) for higher density in a small space and extended electrical functionality. Within the SIP module, the electrical components are mounted to a substrate for structural support and electrical interconnect. An encapsulant is deposited over the electrical components and substrate.

Most if not all SIP modules and WLP arrange the electrical components on a major surface of the substrate. As the SIP module functionality continues to expand, more and more electrical components are placed on the major surface of the substrate and the SIP module becomes larger in surface area. Yet the preferred trend should be to make the SIP module smaller while increasing functionality.

BRIEF DESCRIPTION OF THE DRAWINGS

FIGS. 2a-2h illustrate a process of disposing electrical components over one or more side surfaces of an interconnect substrate to form an SIP module;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
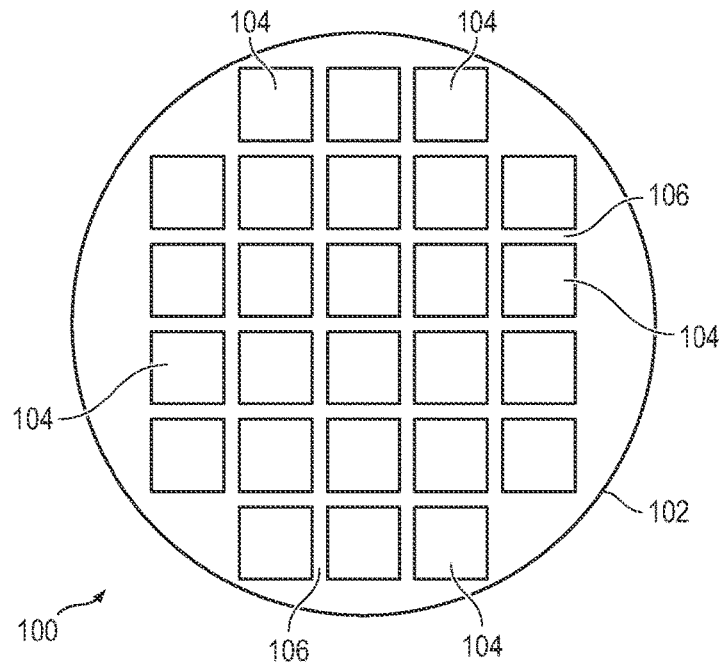
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
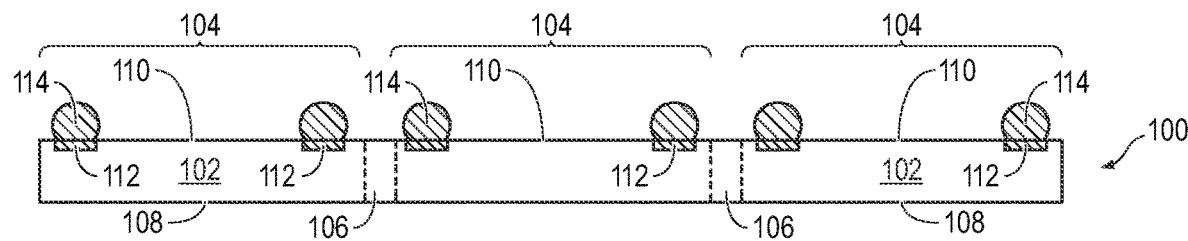

FIG. 1B shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
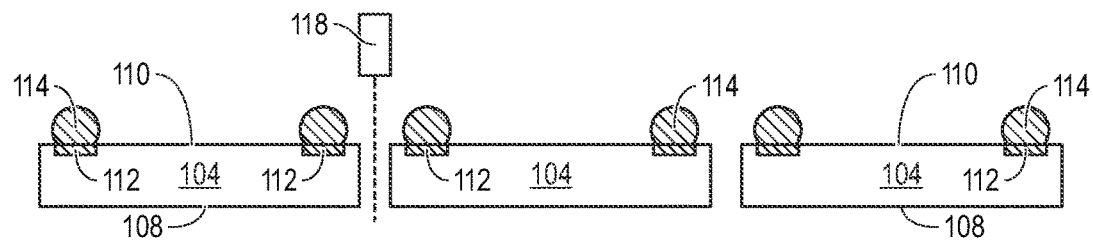

In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die or unit (KGD/KGU) post singulation.

Figure 2G:
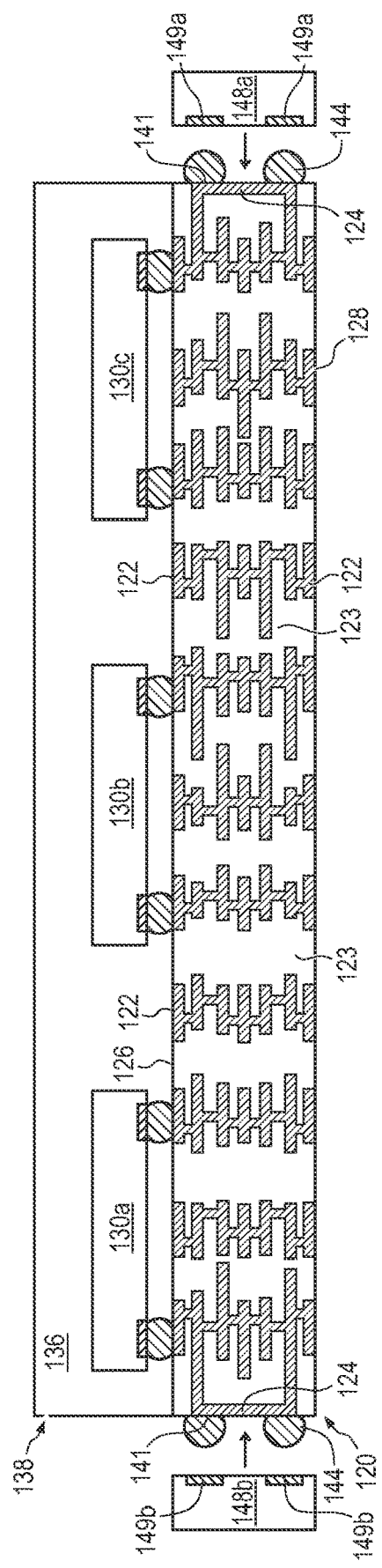

FIGS. 2a-2h illustrate a process of disposing electrical components over a side surface of an interconnect substrate to form an SIP module. FIG. 2a shows a cross-sectional view of multi-layered interconnect substrate 120 including conductive layers 122 and insulating layer 123. Conductive layer 122 can be one or more layers of Al, Cu, Sn, Ni, Au, Ag, or other suitable electrically conductive material. Conductive layer 122 provides horizontal electrical interconnect across substrate 120 and vertical electrical interconnect vias 124 between top major surface 126 and bottom major surface 128 of substrate 120. Portions of conductive layer 122 can be electrically common or electrically isolated depending on the design and function of semiconductor die 104 and other electrical components. Insulating layer 123 contains one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Insulating layer 123 provides isolation between conductive layers 122.

In FIG. 2b, a plurality of electrical components 130a-130c is mounted to surface 126 of interconnect substrate 120 and electrically and mechanically connected to conductive layers 122. Electrical components 130a-130c are each positioned over die attach locations 129a-129c of substrate 120, respectively, using a pick and place operation. For example, electrical component 130a can be similar to semiconductor die 104 from FIG. 1c, with active surface 110 and bumps 114 oriented toward surface 126 of substrate 120. Electrical components 130b and 130c can be similar to semiconductor die 104, although possibly having a different form and function, with active surface 110 and bumps 114 oriented toward surface 126 of substrate 120. Alternatively, electrical components 130a-130c can include other semiconductor die, semiconductor packages, surface mount devices, RF component, discrete electrical devices, or IPDs, such as a resistor, capacitor, and inductor. FIG. 2c illustrates electrical components 130a-130c electrically and mechanically connected to conductive layers 122 and vertical interconnect vias 124 of substrate 120.

In FIG. 2d, an encapsulant or molding compound 136 is deposited over and around electrical components 130a-130c on substrate 120 using a paste printing, compressive molding, transfer molding, liquid encapsulant molding, vacuum lamination, spin coating, or other suitable applicator. Encapsulant 136 can be polymer composite material, such as epoxy resin with filler, epoxy acrylate with filler, or polymer with proper filler. Encapsulant 136 is non-conductive, provides structural support, and environmentally protects the semiconductor device from external elements and contaminants. Electrical components 130a-130c, as mounted to interconnect substrate 120 and covered by encapsulant 136, constitute SIP module or WLP 138.

In FIG. 2e, electrical components 140a and 140b are positioned over side surface 141 of interconnect substrate 120 using a pick and place operation. Side surface 141 is a surface of interconnect substrate 120 between and normal to major surface 126 and major surface 128. Electrical components 140a-140b can be semiconductor die (similar to semiconductor die 104), semiconductor packages, surface mount devices, RF component, discrete electrical devices, or IPDs, such as a resistor, capacitor, and inductor. External connection terminal 142a and 142b of electrical components 140a and 140b are aligned with electrical interconnect compound 144, such as solder or electrically conductive paste. Electrical interconnect compound 144 makes electrical connection between external connection terminals 142a and 142b and conductive layer 122 and vertical interconnect vias 124 of interconnect substrate 120.

FIG. 2f illustrates electrical components 140a-140b electrically and mechanically connected to side surface 141 and conductive layers 122 and vertical interconnect vias 124 of interconnect substrate 120. In the prior art, electrical components like 140a and 140b may have been placed over a major surface of the interconnect substrate, creating the need for a larger surface area to accommodate the components. Instead, electrical components 140a and 140b are disposed over side surface 141 of interconnect substrate 120 thereby reducing the surface area of surface 126 of SIP module 138 dedicated to components.

In another embodiment, continuing from FIG. 2d, electrical components 148a and 148b are positioned over side surface 141 of interconnect substrate 120 using a pick and place operation, as in FIG. 2g. For example, electrical components 148a and 148b can be similar to semiconductor die 104 from FIG. 1c, although having a different form and function, with contact pads 149a and 149b oriented toward side surface 141 of substrate 120. Side surface 141 is a surface of interconnect substrate 120 between and normal to major surface 126 and major surface 128. Alternatively, electrical components 148a-148b can be other semiconductor die, semiconductor packages, surface mount devices, RF component, discrete electrical devices, or IPDs, such as a resistor, capacitor, and inductor. External connection terminal 149a and 149b of electrical components 148a and 148b are aligned with electrical interconnect compound 144, such as solder or electrically conductive paste. Electrical interconnect compound 144 makes electrical connection between external connection terminals 142a and 142b and conductive layer 122 and vertical interconnect vias 124 of interconnect substrate 120. Components having a similar function are assigned the same reference number in the figures.

Figure 2H:
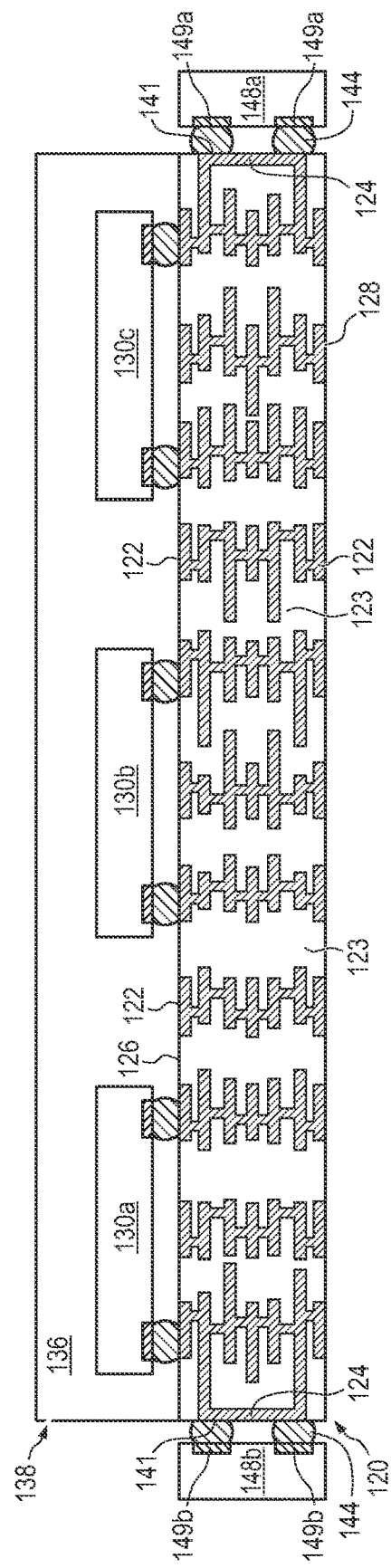

FIG. 2h illustrates electrical components 148a-148b electrically and mechanically connected to side surface 141 and conductive layers 122 and vertical interconnect vias 124 of interconnect substrate 120. In the prior art, electrical components like 148a and 148b may have been placed over a major surface of the interconnect substrate, creating the need for a larger surface area to accommodate the components. Instead, electrical components 148a and 148b are disposed over side surface 141 of interconnect substrate 120 thereby reducing the surface area of surface 126 of SIP module 138 dedicated to components.

Figure 3A:
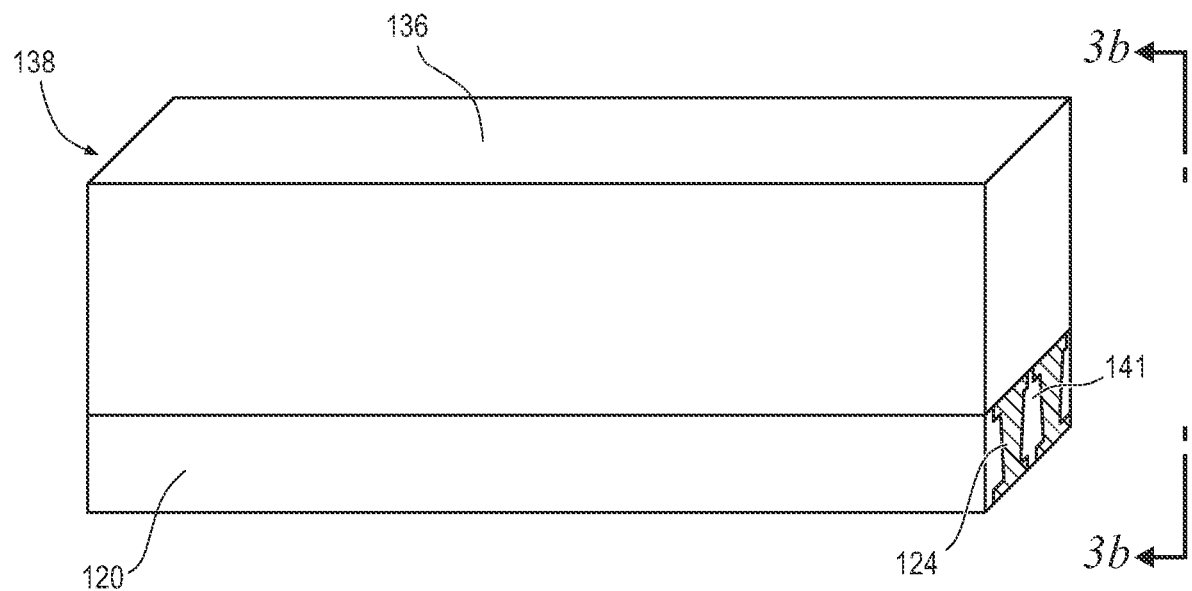
FIGS. 3a-3h illustrate further detail of disposing electrical components over one or more side surfaces of the interconnect substrate.
Figure 3B:
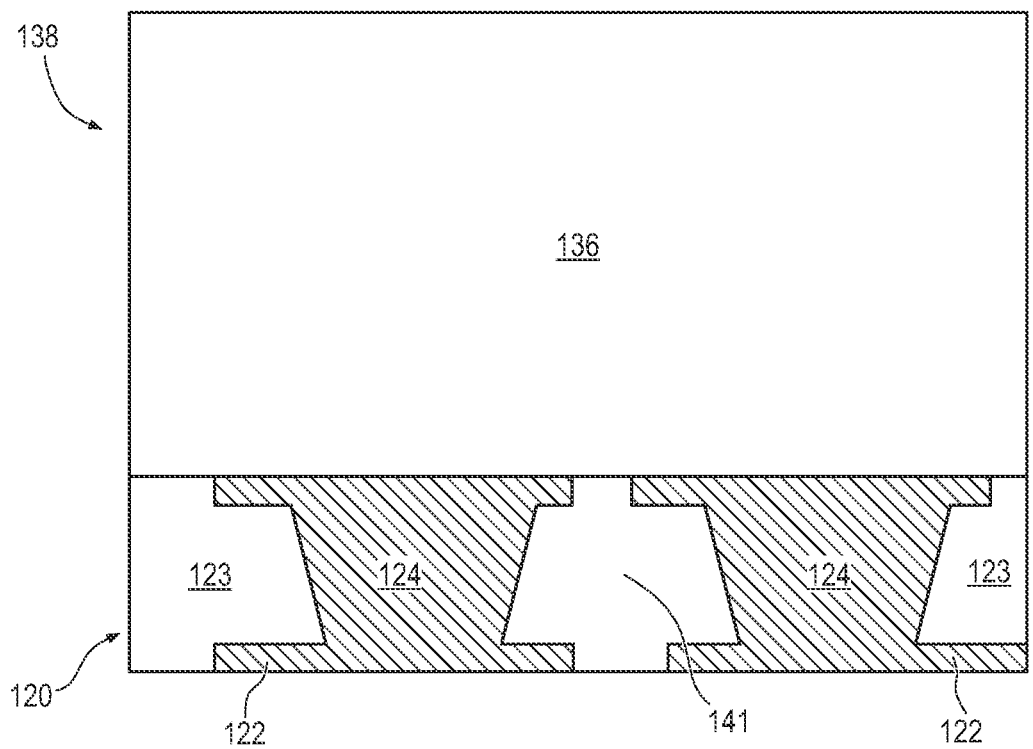
Figure 3C:
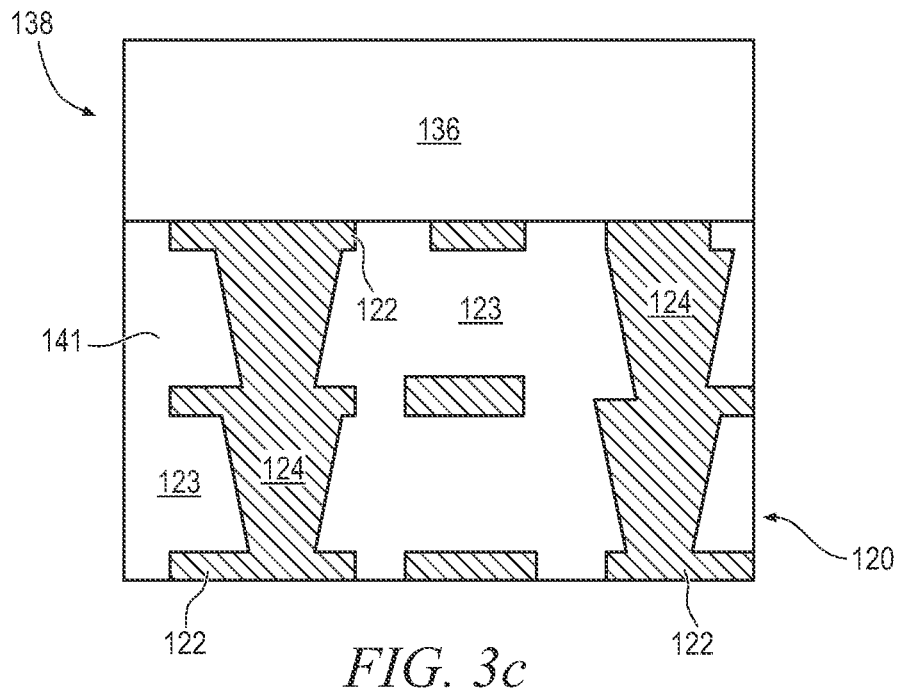
Figure 3D:
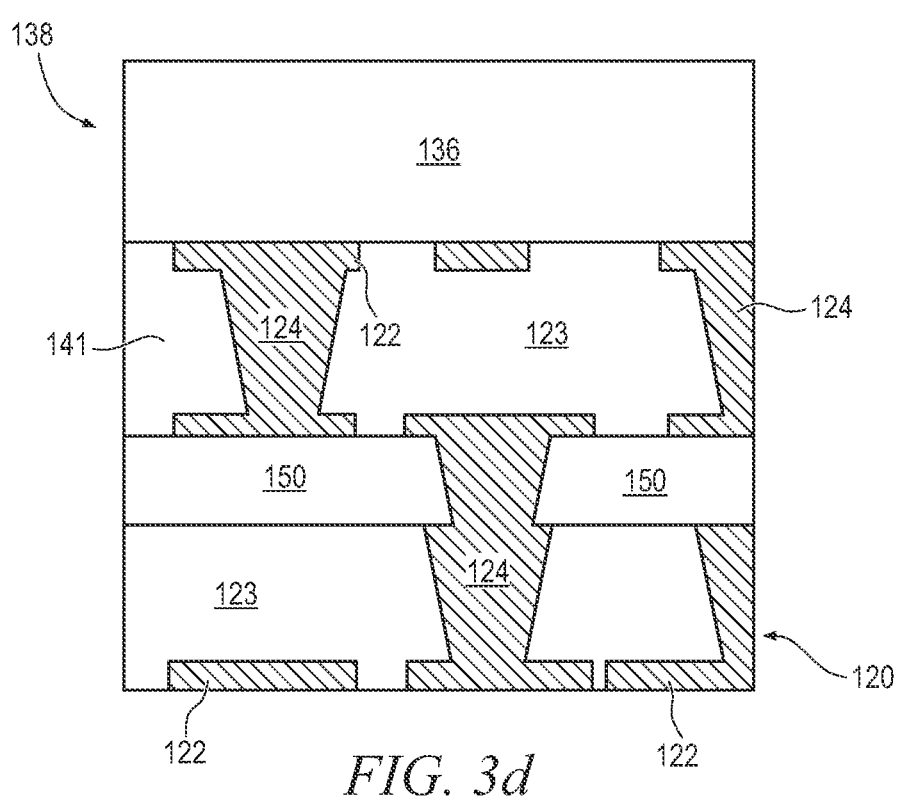

FIG. 3a illustrates SIP module 138 with encapsulant 136 deposited over electrical components 130a-130c and interconnect substrate 120. FIG. 3b is a side view of SIP module 138, from FIG. 3a, showing insulating layers 123 and conductive layers 122 and vertical interconnect via 124 exposed from side surface 141. In another embodiment, FIG. 3c is a side view of SIP module 138 showing insulating layers 123 and conductive layers 122 and stacked vertical interconnect vias 124 exposed from side surface 141. In another embodiment, FIG. 3d is a side view of SIP module 138 showing insulating layers 123, copper clad laminate (CCL) layer 150, conductive layers 122, and offset stacked vertical interconnect vias 124 exposed from side surface 141.

Figure 3E:
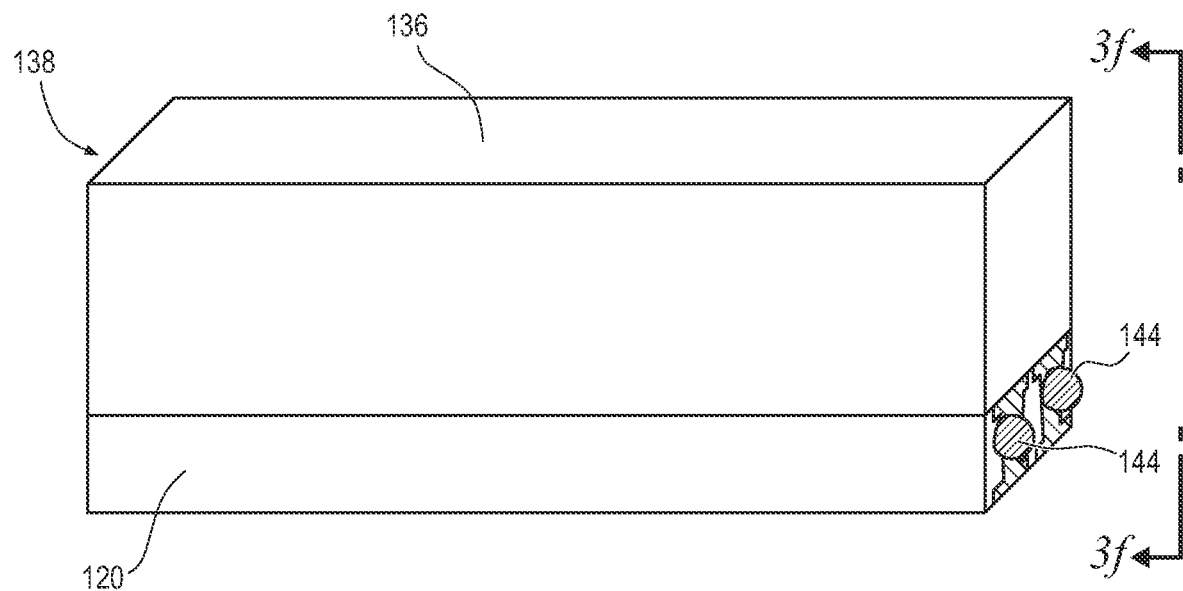
Figure 3F:
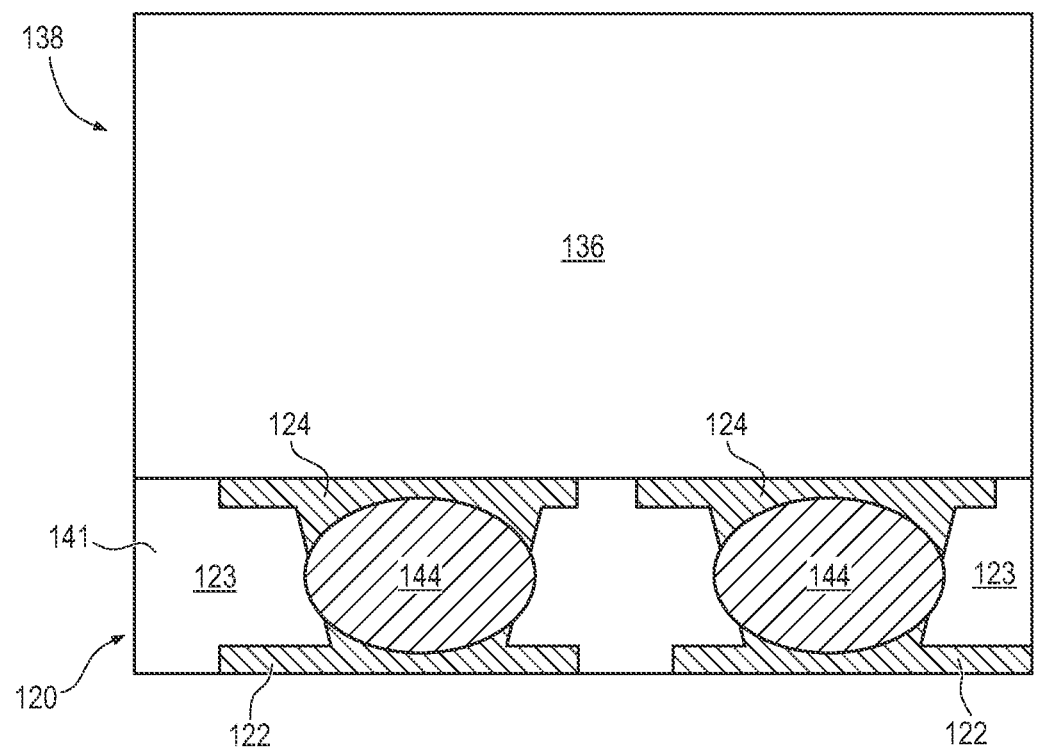

FIG. 3e illustrates SIP module 138 with encapsulant 136 deposited over electrical components 130a-130c and interconnect substrate 120. Electrical interconnect compound 144, such as solder or electrically conductive paste, is deposited over the exposed vertical interconnect vias 124. FIG. 3f is a side view of SIP module 138, from FIG. 3e, showing insulating layers 123 and conductive layers 122 and electrical interconnect compound 144 deposited over the exposed vertical interconnect vias 124 on side surface 141. Electrical interconnect compound 144 can be positioned horizontally or vertically and electrical components 140a-140b are aligned to the electrical interconnect compound.

Figure 3G:
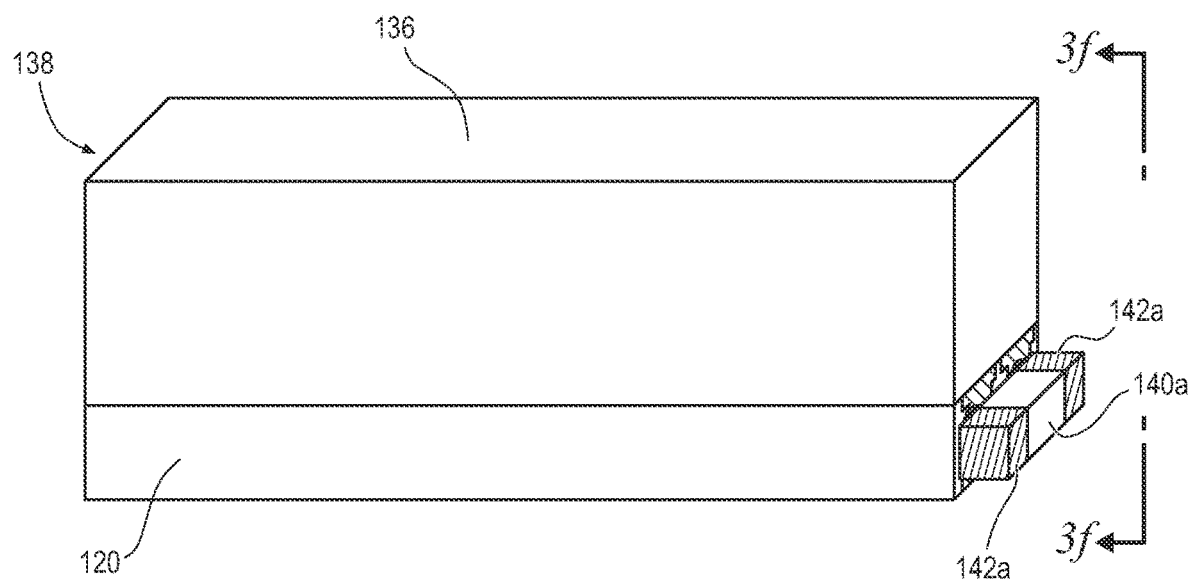
Figure 3H:
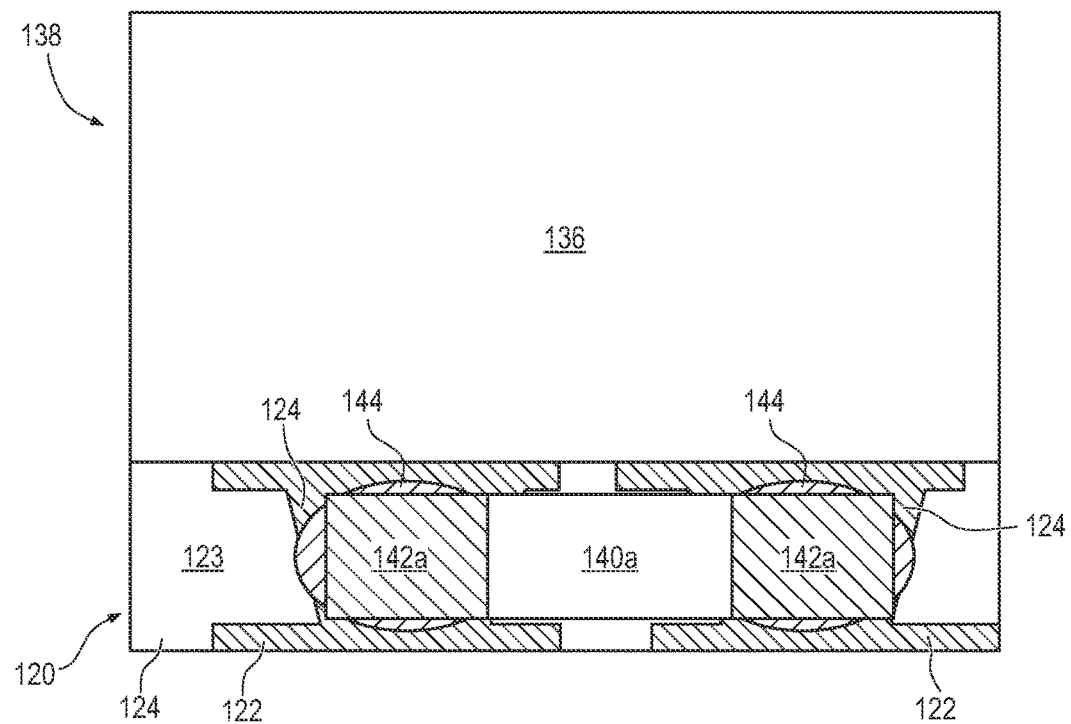

FIG. 3g illustrates SIP module 138 with encapsulant 136 deposited over electrical components 130a-130c and interconnect substrate 120. Electrical components 140a-140b are electrically and mechanically connected to conductive layers 122 and electrical interconnect compound 144 is deposited on the exposed vertical interconnect vias 124 of substrate 120. FIG. 3h is a side view of SIP module 138, from FIG. 3g, showing insulating layers 123 and electrical components 140a-140b electrically and mechanically connected to conductive layers 122 and electrical interconnect compound 144 deposited on the exposed vertical interconnect vias 124 on side surface 141 of substrate 120.

Figure 4A:
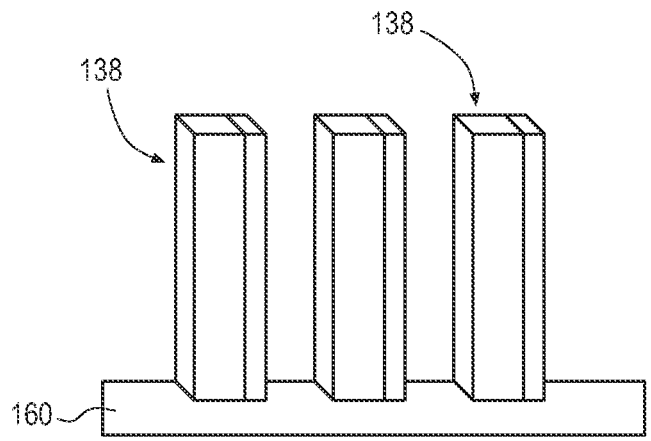
FIGS. 4a-4g illustrate the use of carriers to dispose electrical components over a side surface of the interconnect substrate.
Figure 4B:
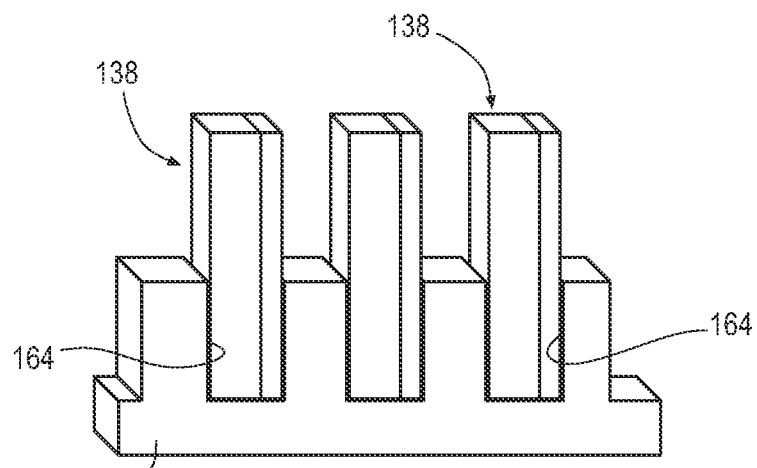

To perform the steps of FIGS. 2a-2h and 3a-3h, a plurality of SIP modules 138 are mounted to carrier 160 with a vertical orientation, as shown in FIG. 4a. Carrier 160 can be a film with an adhesive layer. SIP modules 138 adhere to the adhesive layer of carrier 160. Alternatively, carrier 162 can be a rigid support, such as metal or plastic with a plurality of slots 164 sized to accommodate SIP modules 138, as shown in FIG. 4b. The plurality of SIP modules 138 are positioned within slots 164 with a vertical orientation.

Figure 4C:
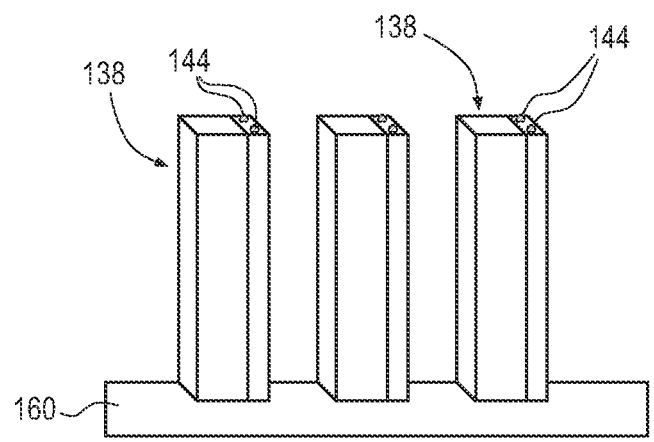
Figure 4D:
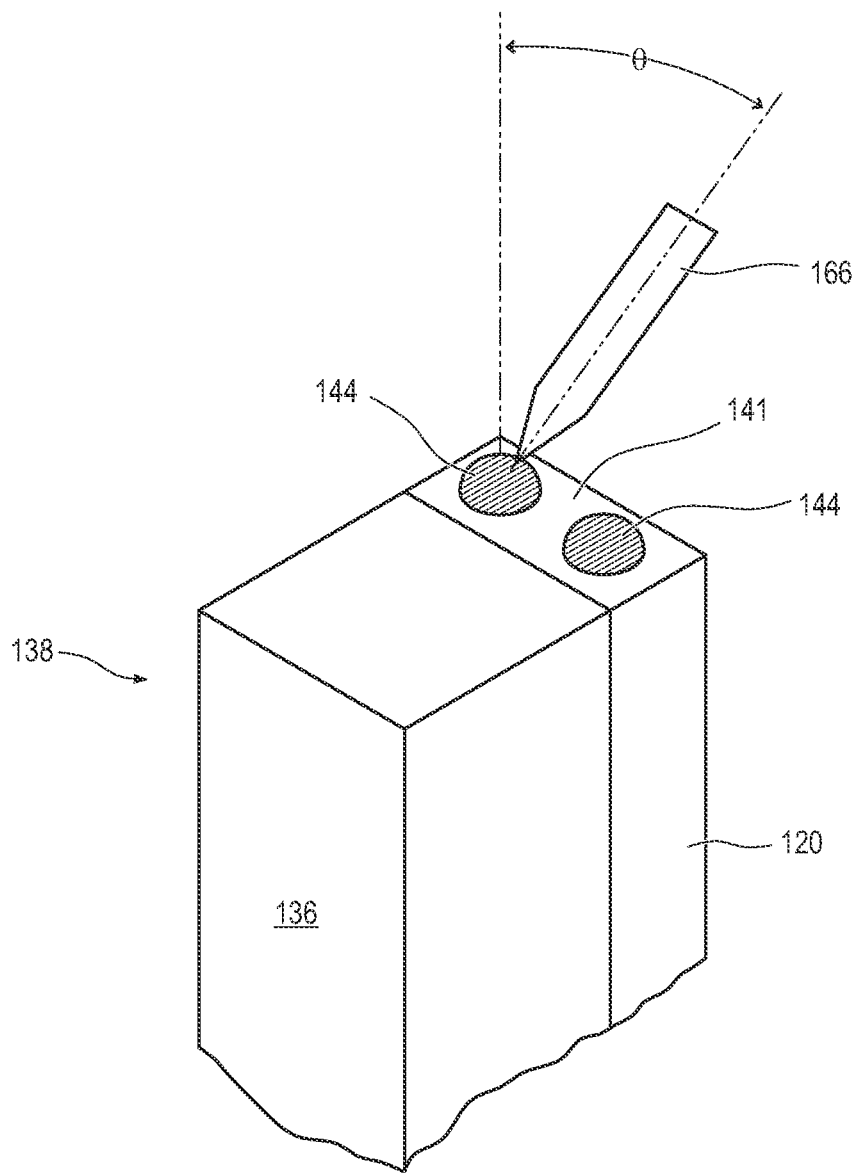

In FIG. 4c, electrical interconnect compound 144, such as solder or electrically conductive paste, is deposited over the exposed vertical interconnect vias 124 on side surface 141 of SIP modules 138 on carrier 160. In particular, electrical interconnect compound 144 is deposited using nozzle 166, as shown in FIG. 4d. Nozzle 166 is tilted at an angle θ of about 25 degrees to reliably and accurately deliver electrical interconnect compound 144 to a smaller area on vertical interconnect vias 124. Tilt dispensing with nozzle 166 enables precise dispensing of electrical interconnect compound 144 on the pad of the vertically-oriented substrate. Nozzle 166 tilted at an angle is able to move to a target location for precision delivery. Accordingly, nozzle 166 deposits electrical interconnect compound 144 on a pad of vertical interconnect vias 124. Alternatively, electrical interconnect compound 144 can be deposited by paste printing or other paste dispensing technology.

Figure 4E:
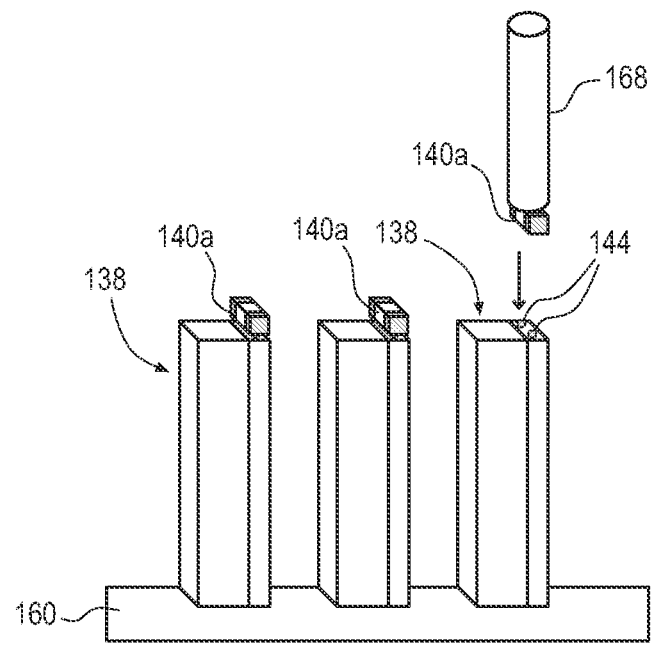
Figure 4F:
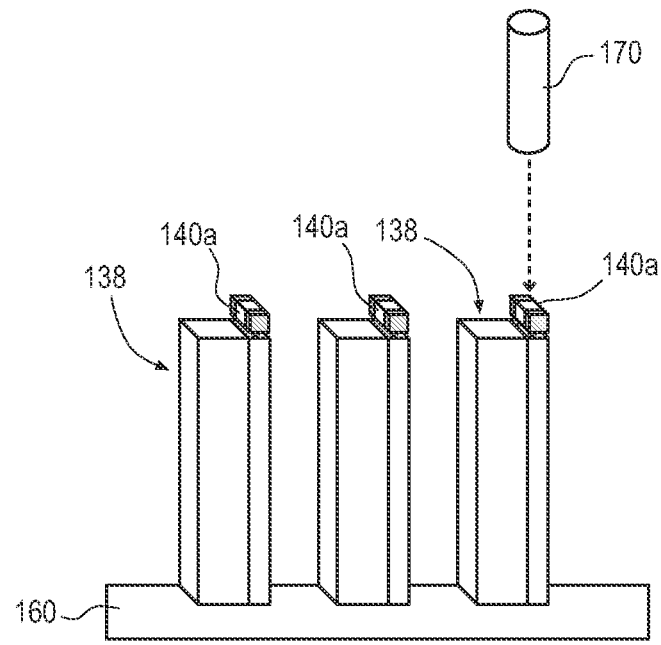
Figure 4G:
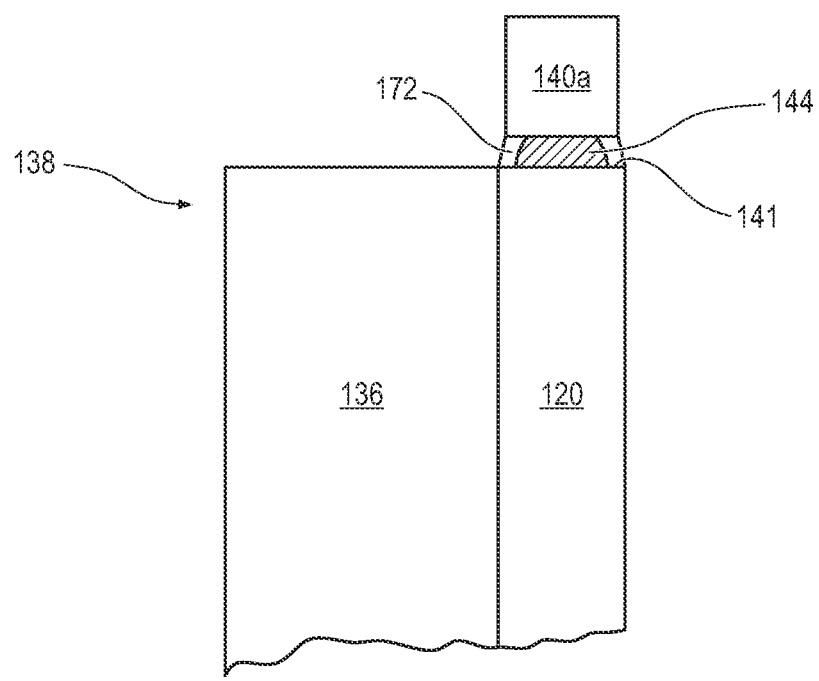

In FIG. 4e, electrical components 140a-140b are positioned over electrical interconnect compound 144 on side surface 141 using pick and place tool 168. In FIG. 4f, electrical components 140a-140b are electrically and mechanically connected to conductive layers 122 and electrical interconnect compound 144 deposited on the exposed vertical interconnect vias 124 on side surface 141 of substrate 120 using laser 170. The laser assist bonding with laser 170 enables component mounting and avoids package warpage as compared to other mass reflow. An underfill material 172, such as an epoxy resin, can be deposited between electrical components 140a-140b and interconnect substrate 120, as shown in FIG. 4g.

Figure 5A:
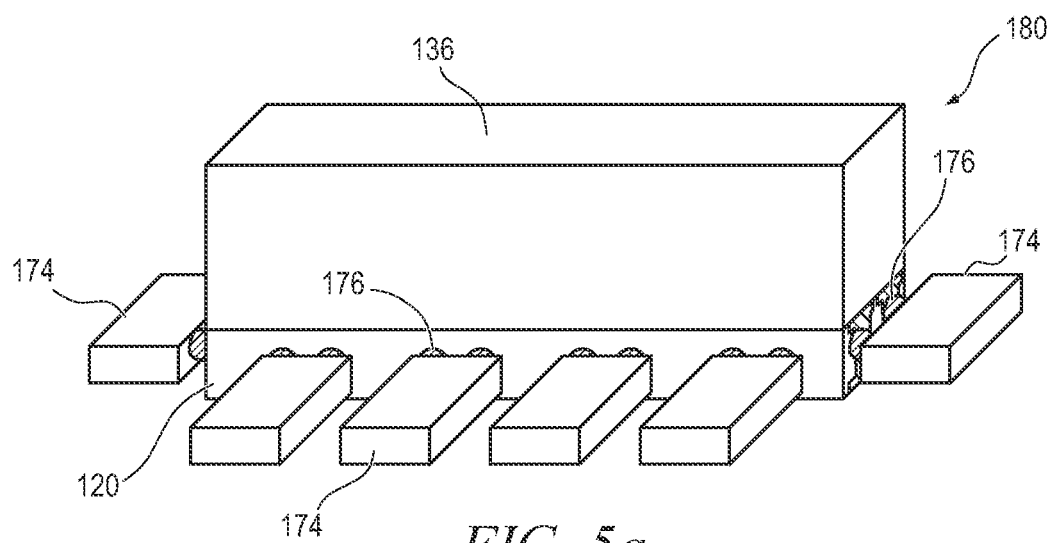
FIGS. 5a-5b illustrate disposing electrical components over multiple side surfaces of the interconnect substrate.
Figure 5B:
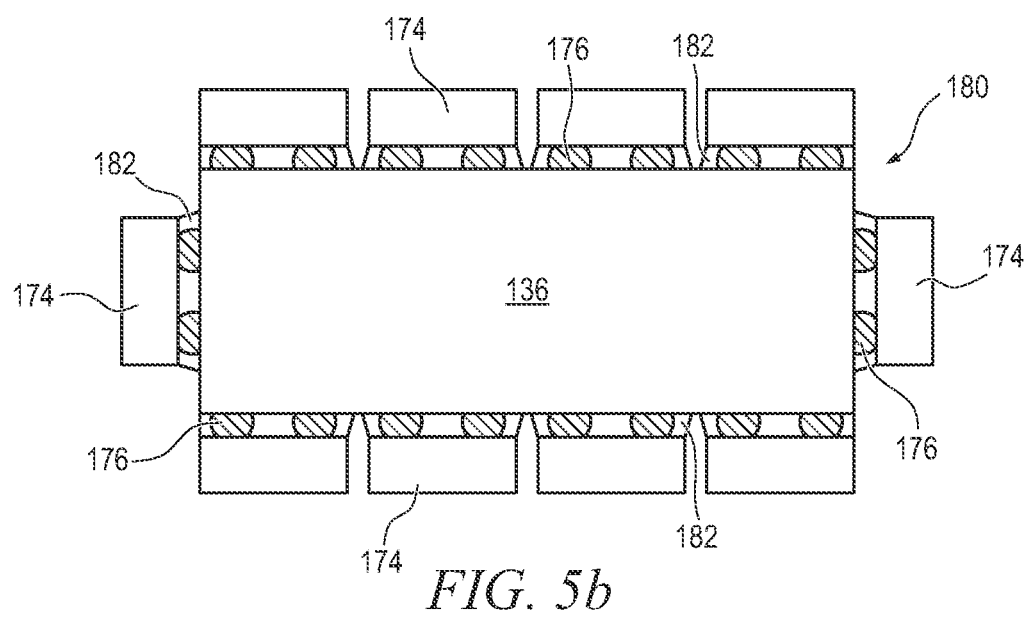

In another embodiment, SIP module 180 may have electrical components 174, similar to electrical components 140a-140b, disposed on one, two, three, or four side surfaces 141. FIG. 5a shows electrical components 174 electrically and mechanically connected to conductive layers 122 and electrical interconnect compound 176 deposited on the exposed vertical interconnect vias 124 on multiple side surface 141 of substrate 120. FIG. 5b is a top view of SIP module 180 showing electrical components 174 electrically and mechanically connected to conductive layers 122 and electrical interconnect compound 176 deposited on the exposed vertical interconnect vias 124 on all four side surfaces 141 of substrate 120. An underfill material 182, such as an epoxy resin, can be deposited between electrical components 174 and interconnect substrate 120.

SIP module 138 or 180 with electrical components 140a-140b or 174 disposed on one or more side surfaces 141 of interconnect substrate 120, as see in FIGS. 2f, 3h, 4f, and 5b, decreases the size of the package and increases space utilization.

Electrical components 130a-130c may contain IPDs that are susceptible to or generate EMI, RFI, harmonic distortion, and inter-device interference. For example, the IPDs contained within electrical components 130a-130c provide the electrical characteristics needed for high-frequency applications, such as resonators, high-pass filters, low-pass filters, band-pass filters, symmetric Hi-Q resonant transformers, and tuning capacitors. In another embodiment, electrical components 130a-130b contain digital circuits switching at a high frequency, which could interfere with the operation of IPDs in the SIP module.

Figure 6:
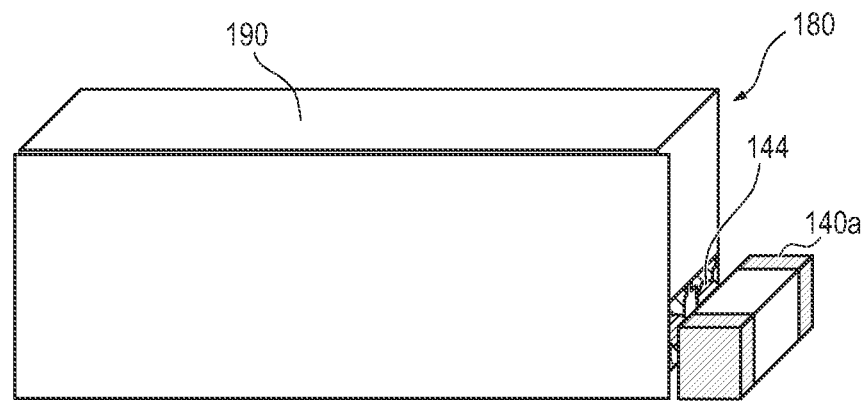
FIG. 6 illustrates a shielding layer over the SIP module with electrical components disposed over one or more side surfaces of the interconnect substrate.

SIP module 138 includes high speed digital and RF electrical components 130a-130c, highly integrated for small size and low height, and operating at high clock frequencies. In FIG. 6, electromagnetic shielding layer 190 is formed or disposed over encapsulant 136 and a portion of interconnect substrate 120 by conformal application of shielding material. Shielding layer 190 can be one or more layers of Al, Cu, Sn, Ni, Au, Ag, or other suitable conductive material. Alternatively, shielding layer 190 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference. In addition, shielding layer 190 covers side surfaces of encapsulant 136, as well as one or more side surfaces of substrate 120. Electromagnetic shielding layer 190 reduces or inhibits EMI, RFI, and other inter-device interference, for example as radiated by high-speed digital devices, from affecting neighboring devices within or adjacent to SIP module 138.

Figure 7:
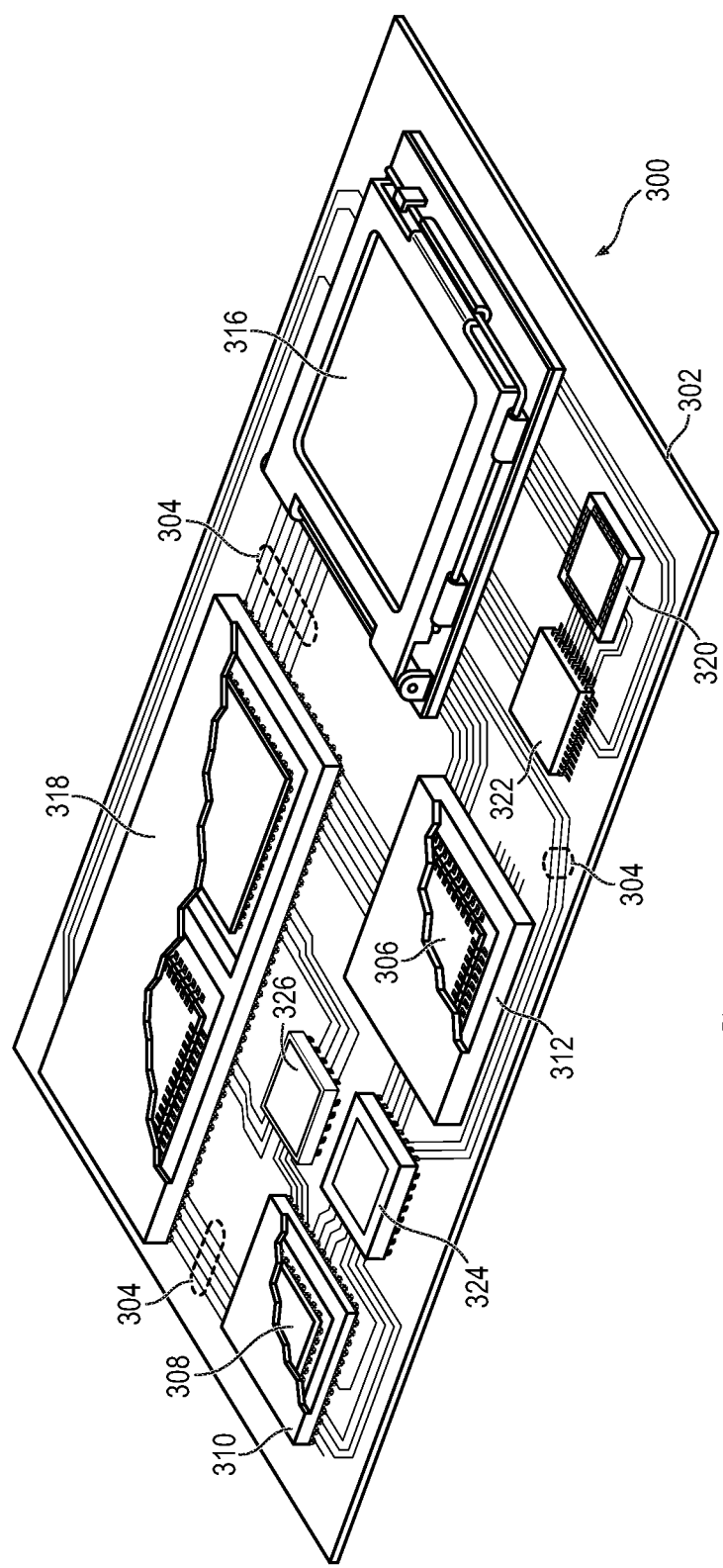
FIG. 7 illustrates a printed circuit board (PCB) with different types of packages mounted to a surface of the PCB.

FIG. 7 illustrates electronic device 300 having a chip carrier substrate or PCB 302 with a plurality of semiconductor packages mounted on a surface of PCB 302, including SIP modules 138 and 180. Electronic device 300 can have one type of semiconductor package, or multiple types of semiconductor packages, depending on the application.

Electronic device 300 can be a stand-alone system that uses the semiconductor packages to perform one or more electrical functions. Alternatively, electronic device 300 can be a subcomponent of a larger system. For example, electronic device 300 can be part of a tablet, cellular phone, digital camera, communication system, or other electronic device. Alternatively, electronic device 300 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 7, PCB 302 provides a general substrate for structural support and electrical interconnect of the semiconductor packages mounted on the PCB. Conductive signal traces 304 are formed over a surface or within layers of PCB 302 using evaporation, electrolytic plating, electroless plating, screen printing, or other suitable metal deposition process. Signal traces 304 provide for electrical communication between each of the semiconductor packages, mounted components, and other external system components. Traces 304 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB. For the purpose of illustration, several types of first level packaging, including bond wire package 306 and flipchip 308, are shown on PCB 302. Additionally, several types of second level packaging, including ball grid array (BGA) 310, bump chip carrier (BCC) 312, land grid array (LGA) 316, multi-chip module (MCM) or SIP module 318, quad flat non-leaded package (QFN) 320, quad flat package 322, embedded wafer level ball grid array (eWLB) 324, and wafer level chip scale package (WLCSP) 326 are shown mounted on PCB 302. In one embodiment, eWLB 324 is a fan-out wafer level package (Fo-WLP) and WLCSP 326 is a fan-in wafer level package (Fi-WLP). Depending upon the system requirements, any combination of semiconductor packages, configured with any combination of first and second level packaging styles, as well as other electronic components, can be connected to PCB 302. In some embodiments, electronic device 300 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
    an interconnect substrate including a conductive layer internal to the interconnect substrate, wherein the conductive layer includes a first conductive via exposed from a side surface of the interconnect substrate;
    a first electrical component disposed over a major surface of the interconnect substrate; and
    a second electrical component disposed in contact with the first conductive via on the side surface of the interconnect substrate.

2. The semiconductor device of claim 1, further including an electrical interconnect compound disposed over the first conductive via exposed from the side surface of the interconnect substrate.

3. The semiconductor device of claim 1, further including a plurality of second electrical components disposed on two or more side surfaces of the interconnect substrate.

4. The semiconductor device of claim 1, wherein the first conductive via includes a plurality of stacked conductive vias and the second electrical component is disposed in contact with the stacked conductive vias.

5. The semiconductor device of claim 1, further including an encapsulant deposited over the first electrical component and interconnect substrate.

6. The semiconductor device of claim 5, further including a shielding layer formed over the encapsulant.

7. The semiconductor device of claim 1, wherein the first conductive via extends from a first surface of the interconnect substrate to a second surface of the interconnect substrate opposite the first surface of the interconnect substrate.

8. The semiconductor device of claim 1, wherein the conductive layer further includes a second conductive via vertically and laterally offset from the first conductive via.

9. A semiconductor device, comprising:
    a substrate including a first conductive via exposed from a side surface of the substrate and a second conductive via exposed from the side surface of the substrate;
    a first electrical component disposed over a major surface of the substrate; and
    a second electrical component disposed over the first conductive via and second conductive via on the side surface of the substrate.

10. The semiconductor device of claim 9, further including an electrical interconnect compound disposed over the side surface of the substrate.

11. The semiconductor device of claim 9, further including a plurality of second electrical components disposed over two or more side surfaces of the substrate.

12. The semiconductor device of claim 9, wherein providing the substrate includes:

forming a conductive layer internal to the substrate, wherein the the first conductive via is part of the conductive layer; and disposing the second electrical component is disposed over the first conductive via.

13. The semiconductor device of claim 9, wherein the substrate includes a plurality of stacked conductive vias and the second electrical component is disposed over the stacked conductive vias.

14. The semiconductor device of claim 9, further including an encapsulant deposited over the first electrical component and substrate.

15. The semiconductor device of claim 14, further including a shielding layer formed over the encapsulant.

16. The semiconductor device of claim 9, wherein the first conductive via extends from a first surface of the substrate to a second surface of the substrate opposite the first surface of the substrate.

17. The semiconductor device of claim 9, wherein the substrate includes a second conductive via vertically and laterally offset from the first conductive via.

18. A method of making a semiconductor device, comprising:

providing an interconnect substrate including a conductive layer internal to the interconnect substrate, wherein the conductive layer includes a first conductive via exposed from a side surface of the interconnect substrate;

disposing a first electrical component over a major surface of the interconnect substrate; and disposing a second electrical component over the first conductive via exposed from a side surface of the interconnect substrate.

19. The method of claim 18, further including disposing an electrical interconnect compound over the first conductive via exposed from the side surface of the interconnect substrate.

20. The method of claim 18, further including disposing a plurality of second electrical components over two or more side surfaces of the interconnect substrate.

21. The method of claim 18, wherein providing the interconnect substrate includes:

forming a plurality of stacked conductive vias through the interconnect substrate; and disposing the second electrical component over the stacked conductive vias.

22. The method of claim 18, further including depositing an encapsulant over the first electrical component and interconnect substrate.

23. The method of claim 22, further including forming a shielding layer over the encapsulant.

24. The method of claim 18, wherein the first conductive via extends from a first surface of the interconnect substrate to a second surface of the interconnect substrate opposite the first surface of the interconnect substrate.

25. The method of claim 18, wherein the conductive layer further includes a second conductive via vertically and laterally offset from the first conductive via.

26. A method of making a semiconductor device, comprising:

providing a substrate including a first conductive via exposed from a side surface of the substrate and a second conductive via exposed from the side surface of the substrate;

disposing a first electrical component over a major surface of the substrate; and disposing a second electrical component over the first conductive via and second conductive via on the side surface of the substrate.

27. The method of claim 26, further including disposing an electrical interconnect compound over the side surface of the substrate.

28. The method of claim 26, further including disposing a plurality of second electrical components over two or more side surfaces of the substrate.

29. The method of claim 26, further including depositing an encapsulant over the first electrical component and substrate.

30. The method of claim 29, further including forming a shielding layer over the encapsulant.

31. The method of claim 26, wherein the first conductive via extends from a first surface of the substrate to a second surface of the substrate opposite the first surface of the substrate.

32. The method of claim 26, wherein the substrate includes a second conductive via vertically and laterally offset from the first conductive via.

* * * * *

UNITED STATES PATENT AND TRADEMARK OFFICE
CERTIFICATE OF CORRECTION

Page 1 of 1

PATENT NO. : 12,400,941 B2
APPLICATION NO. : 17/805096
DATED : August 26, 2025
INVENTOR(S) : GunHyuck Lee et al.

It is certified that error appears in the above-identified patent and that said Letters Patent is hereby corrected as shown below:

In the Claims

Column 9, Claim 12, Line 2, delete the second "the" after the word "wherein".

Column 9, Claim 12, Line 4, delete the words "is disposed".

Signed and Sealed this
Fourteenth Day of October, 2025

John A. Squires
*Director of the United States Patent and Trademark Office*